United States Patent
Wang et al.

(10) Patent No.: US 12,105,903 B2
(45) Date of Patent: Oct. 1, 2024

(54) DISPLAY PANEL AND ELECTRONIC DEVICE

(71) Applicant: WUHAN CHINA STAR OPTOELECTRONICS SEMICONDUCTOR DISPLAY TECHNOLOGY CO., LTD., Wuhan (CN)

(72) Inventors: Haoran Wang, Wuhan (CN); Jing Huang, Wuhan (CN)

(*) Notice: Subject to any disclaimer, the term of this patent is extended or adjusted under 35 U.S.C. 154(b) by 0 days.

(21) Appl. No.: 17/414,336

(22) PCT Filed: May 31, 2021

(86) PCT No.: PCT/CN2021/097433
§ 371 (c)(1),
(2) Date: Jun. 16, 2021

(87) PCT Pub. No.: WO2022/246874
PCT Pub. Date: Dec. 1, 2022

(65) Prior Publication Data
US 2024/0126387 A1    Apr. 18, 2024

(30) Foreign Application Priority Data
May 24, 2021 (CN) .......................... 202110563650.7

(51) Int. Cl.
*G06F 3/041*     (2006.01)
*G06F 3/044*     (2006.01)
*H10K 59/35*     (2023.01)
*H10K 59/40*     (2023.01)

(52) U.S. Cl.
CPC .......... *G06F 3/0412* (2013.01); *G06F 3/0443* (2019.05); *H10K 59/353* (2023.02); *H10K 59/40* (2023.02); *G06F 3/0446* (2019.05); *G06F 2203/04111* (2013.01)

(58) Field of Classification Search
None
See application file for complete search history.

(56) References Cited

U.S. PATENT DOCUMENTS

| 2019/0165061 A1 | 5/2019 | Jung |
| 2021/0013452 A1* | 1/2021 | Kim ..................... G06F 3/0446 |
| 2021/0083012 A1 | 3/2021 | Byun |

FOREIGN PATENT DOCUMENTS

| CN | 107026240 A | 8/2017 |
| CN | 109599425 A | 4/2019 |
| CN | 111668384 A | 9/2020 |

(Continued)

*Primary Examiner* — Duane N Taylor, Jr.

(57) ABSTRACT

The present application provides a display panel and the electronic device. The display panel includes: a substrate; a display layer including light-emitting units; and a touch layer including a first insulating layer, a touch electrode layer, and a second insulating layer. The touch electrode layer includes touch electrodes. Each of the touch electrodes is provided with a first opening corresponding to one of the light-emitting units. Second openings are defined in the first insulating layer and located corresponding to the first openings. The second insulating layer fills the first openings and the second openings, and an included angle between a sidewall of each of the second openings and a side of the first insulating layer close to the display layer is an acute angle.

20 Claims, 3 Drawing Sheets

(56) References Cited

FOREIGN PATENT DOCUMENTS

| | | | | |
|---|---|---|---|---|
| CN | 111722761 | A | 9/2020 | |
| CN | 111883684 | A | 11/2020 | |
| CN | 112216726 | A | 1/2021 | |
| CN | 112885972 | A | 6/2021 | |
| CN | 111357114 | B * | 7/2021 | ............. H01L 27/32 |

* cited by examiner

DISPLAY PANEL AND ELECTRONIC DEVICE

This application is a National Phase Application of PCT Patent Application No. PCT/CN2021/097433 having International filing date of May 31, 2021.

FIELD OF DISCLOSURE

The present application relates to a field of display technology and in particular, to a display panel and an electronic device.

DESCRIPTION OF RELATED ART

Generally, in order to improve luminous efficiency, reduce power consumption, and prolong lifespans of OLED display products, some light extraction structures are arranged in the OLED display products for light extraction, thereby improving external quantum efficiency of light-emitting devices.

At present, a known solution is to stack a patterned organic layer with a low refractive index and a planarization layer with a high refractive index on a touch layer, and use an interface between the organic layer and the planarization layer to converge light. However, this results in a greater number of film layers in a display panel.

SUMMARY

The present application provides a display panel and an electronic device, which can reduce a number of film layers of the display panel, thereby reducing a thickness of the display panel.

In a first aspect, the present application provides a display panel, comprising:
- a substrate;
- a display layer arranged on the substrate, the display layer comprising a plurality of light-emitting units; and
- a touch layer disposed on one side of the display layer away from the substrate, the touch layer comprising a first insulating layer, a touch electrode layer, and a second insulating layer stacked on each other in sequence;
- wherein the touch electrode layer comprises a plurality of touch electrodes, each of the touch electrodes is provided with a first opening located corresponding to a corresponding one of the light-emitting units, a plurality of second openings are defined in the first insulating layer and located corresponding to the first openings, the second insulating layer fills the first openings and the second openings, and an included angle between a sidewall of each of the second openings and a side of the first insulating layer close to the display layer is an acute angle.

In the display panel of the present application, a refractive index of a material of the second insulating layer is higher than a refractive index of a material of the first insulating layer.

In the display panel of the present application, the refractive index of the material of the second insulating layer is in a range of 1.6 to 1.8, and the refractive index of the material of the first insulating layer is in a range of 1.4 to 1.6.

In the display panel of the present application, the material of the first insulating layer is an inorganic material, and the material of the second insulating layer is an organic material.

In the display panel of the present application, the sidewall of each of the second openings has a bent shape.

In the display panel of the present application, each of the second openings comprises a first sub-opening and a second sub-opening, and an included angle between a sidewall of each of the second sub-openings and the side of the first insulating layer close to the display layer is not equal to an included angle between a sidewall of each of the first sub-openings and the side of the first insulating layer close to the display layer.

In the display panel of the present application, the included angle between the sidewall of each of the second sub-openings and the side of the first insulating layer close to the display layer is greater than the included angle between the sidewall of each of the first sub-openings and the side of the first insulating layer close to the display layer.

In the display panel of the present application, an area of an orthographic projection of the sidewall of each of the second sub-openings projected on the substrate is smaller than or equal to an area of an orthographic projection of the sidewall of each of the first sub-openings projected on the substrate.

In the display panel of the present application, a shape of an orthographic projection of each of the second openings projected on the substrate is the same as a shape of an orthographic projection of the corresponding light-emitting unit projected on the substrate.

In the display panel of the present application, an area of the orthographic projection of each of the second openings projected on the substrate is equal to an area of the orthographic projection of the corresponding light-emitting unit projected on the substrate.

In the display panel of the present application, a shape of each of the second openings in a top view comprises at least one of circular, elliptical, diamond, or square.

The display panel of the present application further comprises a third insulating layer disposed between the display layer and the touch layer, wherein a plurality of bridge lines are arranged between the third insulating layer and the first insulating layer, each of the touch electrodes comprises a first portion and a second portion, and the first portion and the second portion are connected through the bridge lines.

In a second aspect, the present application further provides an electronic device, the electronic device comprising a display panel, the display panel comprising:
- a substrate;
- a display layer arranged on the substrate, the display layer comprising a plurality of light-emitting units; and
- a touch layer disposed on one side of the display layer away from the substrate, the touch layer comprising a first insulating layer, a touch electrode layer, and a second insulating layer stacked in sequence,
- wherein the touch electrode layer comprises a plurality of touch electrodes, each of the touch electrodes is provided with a first opening located corresponding to a corresponding one of the light-emitting units, a plurality of second openings are defined in the first insulating layer and located corresponding to the first openings, the second insulating layer fills the first openings and the second openings, and an included angle between a sidewall of each of the second openings and a side of the first insulating layer close to the display layer is an acute angle.

In the electronic device of the present application, a refractive index of a material of the second insulating layer is higher than a refractive index of a material of the first insulating layer.

In the electronic device of the present application, the refractive index of the material of the second insulating layer is in a range of 1.6 to 1.8, and the refractive index of the material of the first insulating layer is in a range of 1.4 to 1.6.

In the electronic device of the present application, the material of the first insulating layer is an inorganic material, and the material of the second insulating layer is an organic material.

In the electronic device of the present application, the sidewall of each of the second openings has a bent shape.

In the electronic device of the present application, each of the second openings comprises a first sub-opening and a second sub-opening, and an included angle between a sidewall of each of the second sub-openings and the side of the first insulating layer close to the display layer is not equal to an included angle between a sidewall of each of the first sub-openings and the side of the first insulating layer close to the display layer.

In the electronic device of the present application, the included angle between the sidewall of each of the second sub-openings and the side of the first insulating layer close to the display layer is greater than the included angle between the sidewall of each of the first sub-openings and the side of the first insulating layer close to the display layer.

In the electronic device of the present application, an area of an orthographic projection of the sidewall of each of the second sub-openings projected on the substrate is smaller than or equal to an area of an orthographic projection of the sidewall of each of the first sub-openings projected on the substrate.

Advantages of the Present Application

The display panel and the electronic device of the present application comprise: a substrate; a display layer disposed on the substrate, the display layer comprising a plurality of light-emitting units; a first insulating layer arranged on the display layer; a plurality of touch units arranged at intervals on the first insulating layer, each of the touch units arranged as metal lines in a grid pattern; a second insulating layer comprising a plurality of second openings, positions of the second openings arranged corresponding to positions of grid holes of the touch units; a third insulating layer covering the touch units and the second openings; wherein a refractive index of a material of the third insulating layer is higher than a refractive index of a material of the second insulating layer, and an inclined angle between a sidewall of each of the second openings and the first insulating layer is an acute angle; a display layer arranged on the substrate, the display layer comprising a plurality of light-emitting units; and a touch layer disposed on one side of the display layer away from the substrate, the touch layer comprising a first insulating layer, a touch electrode layer, and a second insulating layer stacked on each other in sequence. The touch electrode layer comprises a plurality of touch electrodes, each of the touch electrodes is provided with a first opening located corresponding to a corresponding one of the light-emitting units, a plurality of second openings are defined in the first insulating layer and located corresponding to the first openings, the second insulating layer fills the first openings and the second openings, and an included angle between a sidewall of the second opening and a side of the first insulating layer close to the display layer is an acute angle. Since the first insulating layer and the second insulating layer in the touch layer are combined to form a light extraction structure, the present application can save one insulating layer, thus reducing a number of film layers and reducing a thickness of the display panel.

BRIEF DESCRIPTION OF DRAWINGS

In order to more clearly illustrate the technical solutions in the embodiments of the present application, figures which will be described in the embodiments are briefly introduced hereinafter. It is obvious that the drawings are merely for the purposes of illustrating some embodiments of the present disclosure, and a person having ordinary skills in this field can obtain other figures according to these figures without inventive work.

DETAILED DESCRIPTION OF EMBODIMENTS

The present application is described below with reference to the accompanying drawings and in conjunction with specific embodiments. The directional terms mentioned in the present application, such as "up", "down", "front", "rear", "left", "right", "inner", "outer", "lateral", etc., are only based on the directions of the accompanying drawings. Therefore, the directional terms are used for illustrative purposes and ease of understanding the present application, rather than limiting the present application. In the drawings, elements with similar structures are indicated by the same reference numerals.

The terms "first", "second", etc. in the specification, and claims and the accompanying drawings of the present application mentioned above are used to distinguish different objects, rather than to describe a specific sequence. In addition, the terms "comprising", "including", and any variations thereof are intended to cover non-exclusive inclusions.

Figure 1:
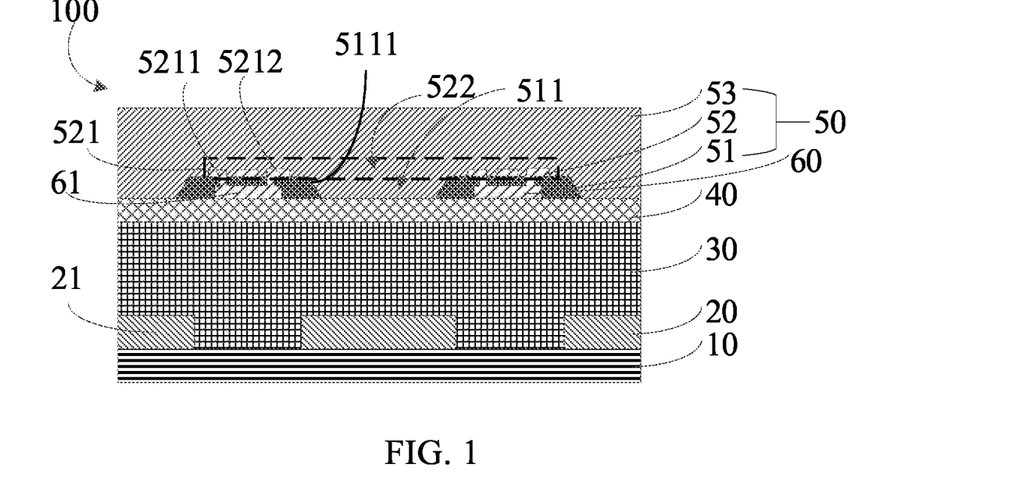
FIG. 1 is a cross-sectional view of a display panel according to a first embodiment of the present application.
Figure 2:
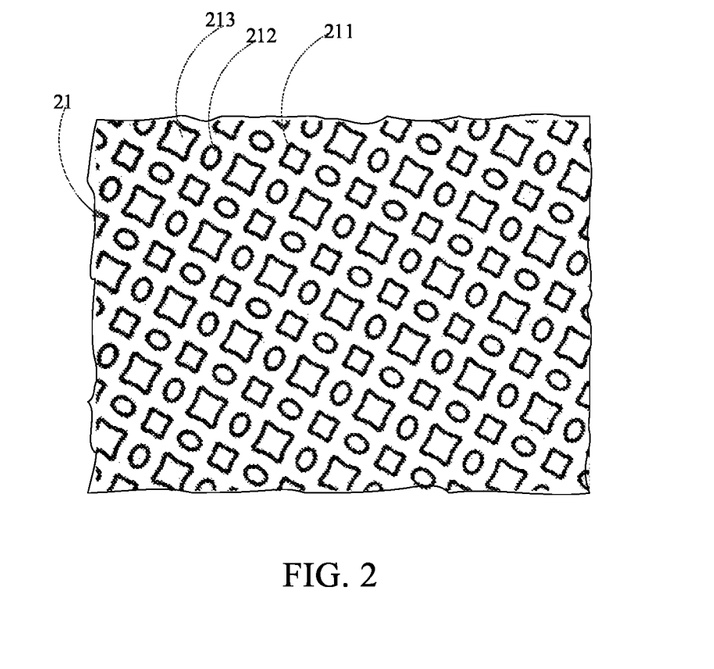
FIG. 2 is a top view of light-emitting units of the display panel according to one embodiment of the present application.
Figure 3:
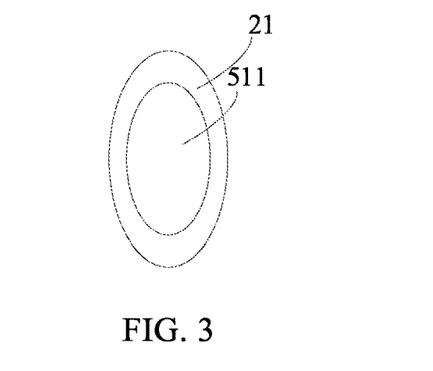
FIG. 3 is a top view of a set of the light-emitting unit and a second opening of the display panel according to one embodiment of the present application.

Please refer to FIGS. 1 to 3. FIG. 1 is a cross-sectional view of a display panel according to a first embodiment of the present application. FIG. 2 is a top view of light-emitting units of the display panel according to one embodiment of the present application. FIG. 3 is a top view of a set of the light-emitting unit and a second opening of the display panel according to one embodiment of the present application. As shown in FIG. 1, the display panel 100 of the present embodiment comprises a substrate 10, a display layer 20, an encapsulation layer 30, a third insulating layer 40, and a touch layer 50. The substrate 10, the display layer 20, the encapsulation layer 30, the third insulating layer 40, and the touch control layer 50 are stacked on each other in sequence.

The substrate 10 comprises a base plate and a switch array layer. A material of the base plate comprises one or more of glass, silicon dioxide, polyethylene, polypropylene, polystyrene, polylactic acid, polyethylene terephthalate, polyimide, and polyurethane. The switch array layer comprises film layers constituting a plurality of transistors. Each of the transistors can be a transistor with a top gate structure or a transistor with a bottom gate structure, and the present application is not limited in this regard.

The display layer 20 comprises a plurality of light-emitting units 21. With reference to FIG. 2, the light-emitting units 21 comprise a red light-emitting unit 211, a green light-emitting unit 212, and a blue light-emitting unit 213. Each of the light-emitting units 21 comprises a first electrode, a light-emitting layer, and a second electrode. In one embodiment, the first electrode is an anode, and the second electrode is a cathode. A material of the first electrode can be a laminated structure of ITO/Ag/ITO. A material of the light-emitting layer can comprise a first light-emitting material, a second light-emitting material, and a third light-emitting material. The second electrode is disposed on the light-emitting layer, and a material of the second electrode can be a transparent conductive material. Certainly, it can be understood that the structure of the display layer is not limited in this regard.

The encapsulation layer 30 is disposed on the display layer 20. In one embodiment, the encapsulation layer 30 comprises a first inorganic layer (not illustrated in the drawings). In another embodiment, the encapsulation layer 30 comprises a first inorganic layer and a second inorganic layer (neither are illustrated) disposed on the first inorganic layer. In addition, the encapsulation layer 30 can also comprise an organic layer located between the first inorganic layer and the second inorganic layer.

The third insulating layer 40 is disposed on the encapsulation layer 30. A material of the third insulating layer 40 comprises one or more of SiO2, SiNx, and Al2O3. The third insulating layer 40 is used to isolate the encapsulation layer 30 from the touch layer 50.

The touch layer 50 is disposed on the third insulating layer 40. That is to say, the touch layer 50 is disposed at one side of the display layer 20 away from the substrate 10. The touch layer 50 comprises a first insulating layer 51, a touch electrode layer 52, and a second insulating layer 53 stacked in sequence. The touch electrode layer 52 comprises a plurality of touch electrodes 521. Each of the touch electrodes 521 is provided with a first opening 522 located corresponding to a corresponding one of the light-emitting units 21. In other words, each of the first openings 522 is defined between adjacent touch electrodes 521. A plurality of second openings 511 are defined in the first insulating layer 51 and located corresponding to the plurality of first openings 522. The second insulating layer 53 fills the first openings 522 and the second openings 511. An included angle between a sidewall 5111 of each of the second openings 511 and a side of the first insulating layer 51 close to the display layer 20 is an acute angle.

Specifically, the display panel 100 further comprises a conductive layer 60. The conductive layer 60 is disposed on the third insulating layer 40. The conductive layer 60 comprises a plurality of bridge lines 61. Specifically, the conductive layer 60 is disposed on a portion of the third insulating layer 40. That is to say, the conductive layer 60 is disposed between the third insulating layer 40 and the first insulating layer 51. A material of the conductive layer 60 can be a metal material, such as Ti/Al/Ti, but certainly, the specific material is not limited thereto. In other embodiments, the material of the conductive layer 60 can also be a transparent conductive material, but the specific material is not limited thereto.

The touch electrode layer 52 is disposed on the conductive layer 60. The touch electrode layer 52 is connected to the conductive layer 60. In one embodiment, the touch electrode layer 52 can comprise a first portion 5211 and a second portion 5212. The first portion 5211 and the second portion 5212 are arranged crosswise. The first portion 5211 is connected to the second portion 5212 through the bridge lines 61. A material of the touch electrode layer 52 can be the same as the material of the conductive layer 60. A shape of the touch electrode 521 in a top view can be a grid shape.

In some embodiments, the sidewall 5111 of the second opening 511 is oblique with respect to the side of the first insulating layer 51 close to the display layer 20. That is to say, there is the included angle between the sidewall 5111 of the second opening 511 and the side of the first insulating layer 51 close to the display layer 20. In one embodiment, a plurality of via holes are defined in the first insulating layer 51, and the touch electrode layer 52 extends into the via holes and are connected to the conductive layer 60.

The second insulating layer 53 covers the touch electrodes 521 and the second openings 511. The second insulating layer 53 is disposed on the touch electrode layer 52. A refractive index of a material of the second insulating layer 53 is higher than a refractive index of a material of the first insulating layer 51. A thickness of the second insulating layer 53 and a thickness of the first insulating layer 51 should be set according to specific requirements. In one embodiment, in order to reduce a loss of light, the materials of the second insulating layer 53 and the first insulating layer 51 are transparent insulating materials. The second insulating layer 53 uses a material with good leveling properties to improve flatness of a surface of the display panel.

In some embodiments, in order to further improve light output efficiency, the material of the first insulating layer 51 is an inorganic material, and the material of the second insulating layer 53 is an organic material. As the present application adopts a light-convergence interface composed of the inorganic material with a low refractive index and the organic material with a high refractive index, the light output efficiency is improved. The material of the first insulating layer 51 can comprise, but is not limited to, $SiON_X$ or $SiO_2$. The material of the second insulating layer 53 can comprise a photosensitive resin composition. In some embodiments, in order to further reduce a thickness of the display panel, the material of the second insulating layer 53 is an organic transparent optical adhesive.

In some embodiments, in order to further improve the light extraction efficiency, the refractive index of the material of the second insulating layer 53 ranges from 1.6 to 1.8, and the refractive index of the material of the first insulating layer 51 ranges from 1.4 to 1.6. It can be understood that, in other embodiments, the refractive index of the material of the second insulating layer 53 and the refractive index of the first insulating layer 51 are not limited to the foregoing ranges.

Since the first insulating layer 51 and the second insulating layer 53 in the touch layer 50 cooperate to form a light extraction structure, one insulating layer can be saved, thus reducing a number of film layers and reducing the thickness of the display panel.

In some embodiments, as shown in FIG. 2, in order to further enhance light-convergence performance, the second openings 511 are located corresponding to the light-emitting units 21, and a cross-sectional shape of each of the second openings 511 is the same as a cross-sectional shape of the corresponding light-emitting unit 21. Certainly, in other embodiments, the cross-sectional shape of each of the second openings 511 can also be different from the cross-sectional shape of the corresponding light-emitting unit 21, and in this case, there is a preset range for a difference between an area of an orthographic projection of each of the second openings 511 projected on the substrate 10 and an area of an orthographic projection of the corresponding light-emitting unit 21 projected on the substrate 10, and the preset range is close to zero.

In some embodiments, a shape of each of the second openings 511 in a top view comprises at least one of circular, elliptical, diamond, or square. It can be understood that shapes of the red light-emitting unit 211, the green light-emitting unit 212, and the blue light-emitting unit 213 in a top view can also comprise at least one of circular, elliptical, diamond, or square. For example, the shape in the top view of the green light-emitting unit 212 is elliptical, and the shape in the top view of the second openings 511 corresponding to the green light-emitting unit 212 is also elliptical. Certainly, it can be understood that for the light-emitting units of other colors, each has the shape of the corresponding second opening 511 by analogy, and a detailed description thereof is not repeated here for brevity. Certainly, the shapes of the light-emitting units are not limited in this regard.

In some embodiments, in order to further increase a light output rate, the area of the orthographic projection of each of the second openings 511 projected on the substrate 10 is equal to or almost equal to the area of the orthographic projection of the corresponding light-emitting unit 21 projected on the substrate 10. In some embodiments, the area of the orthographic projection of each of the second openings 511 projected on the substrate 10 is slightly larger or slightly smaller than the area of the orthographic projection of the corresponding light-emitting unit 21 projected on the substrate 10. In other words, the orthographic projection of the second opening 511 projected on the substrate overlaps the orthographic projection of the light-emitting unit projected on the substrate 10, or there is a certain included angle between a horizontal symmetry axis of the shape of each of the second openings 511 in the top view and a horizontal symmetry axis of the corresponding light-emitting unit 21.

In some embodiments, the above-mentioned display panel 100 further comprises a cover plate, and the cover plate is attached to the third insulating layer 40 by an adhesive.

The display panel of the present application comprises: a substrate; a display layer arranged on the substrate; the display layer comprising a plurality of light-emitting units; a first insulating layer arranged on the display layer; a plurality of touch units arranged at intervals on the first insulating layer, each of the touch units arranged as metal lines in a grid pattern; a second insulating layer comprising a plurality of second openings, positions of the second openings are located corresponding to grid holes of the touch electrodes; and a third insulating layer covering the touch units and the second opening. A refractive index of a material of the third insulating layer is higher than a refractive index of a material of the second insulating layer. An inclined angle between a sidewall of each of the second openings and the first insulating layer is an acute angle. Because the first insulating layer and the second insulating layer in the touch layer are combined to form a light extraction structure, the present application can save one insulating layer, and a number of film layers is reduced, thereby reducing a thickness of the display panel.

Figure 4:
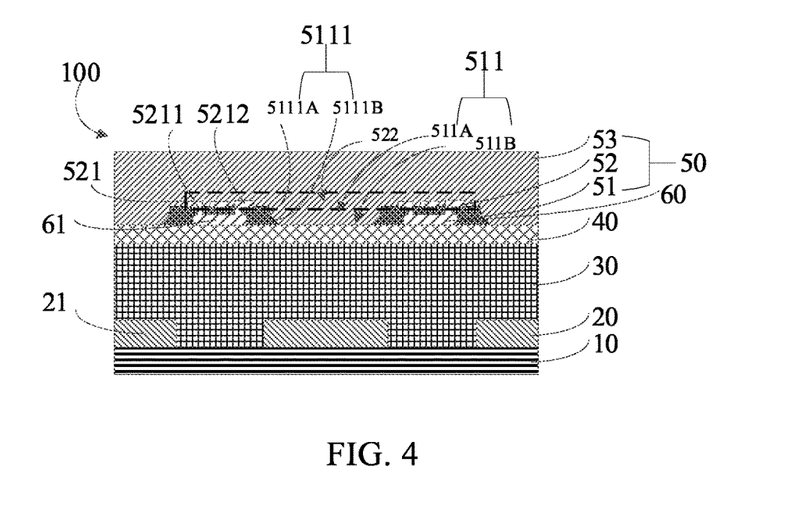
FIG. 4 is a cross-sectional view of the display panel according to a second embodiment of the present application.

Please refer to FIG. 4, which is a cross-sectional view of the display panel according to a second embodiment of the present application.

As shown in FIG. 4, the display panel 100 of the present embodiment is different from the display panel 100 of the previous embodiment in that a shape of the sidewall 5111 of the second opening 511 of the present embodiment is a bent shape, that is, a non-linear shape.

In some embodiments, as shown in FIG. 4, each of the second openings 511 comprises a first sub-opening 511A and a second sub-opening 511B. An inclined angle between a sidewall 5111B of the second sub-opening 511B and the side of the first insulating layer 51 close to the display layer 20 is not equal to an included angle between a sidewall 5111A of the first sub-opening 511A and the side of the first insulating layer 51 close to the display layer 20. In other words, the sidewall 5111 of the second opening 511 has slopes at two angles.

In one embodiment, the included angle between the sidewall 5111B of the second sub-opening 511B and the side of the first insulating layer 51 close to the display layer 20 is greater than the included angle between the sidewall 5111A of the first sub-opening 511A and the side of the first insulating layer 51 close to the display layer 20. For example, the included angle between the sidewall 5111B of the second sub-opening 511B and the side of the first insulating layer 51 close to the display layer 20 is 90 degrees, and the included angle between the sidewall 5111A of the first sub-opening 511A and the side of the first insulating layer 51 close to the display layer 20 is less than 90 degrees. In some embodiments, an area of an orthographic projection of the second sub-opening 511B projected on the substrate 10 is smaller than an area of an orthographic projection of the first sub-opening 511A projected on the substrate 10. In other embodiments, the area of the orthographic projection of the second sub-opening 511B projected on the substrate 10 can also be larger than the area of the orthographic projection of the first sub-opening 511A projected on the substrate 10.

In a specific manufacturing process, the first insulating layer 51 can be patterned to obtain the second openings 511, and then the second openings 511 can be etched multiple times to obtain the first sub-openings 511A and the second sub-openings 511B.

Certainly, it can be understood that the second openings 511 can comprise more sub-slopes at angles. That is to say, the second opening 511 can also comprise more than two sub-openings, which only requires that sidewalls of each two adjacent sub-openings form unequal angles with the first insulating layer 51. Alternatively, a shape of the sidewall 5111 of the second opening 511 is a bent shape, that is, an uneven structure. In the cross-sectional view, the cross-sectional shape of the second opening 511 is not trapezoidal, and the shape of the sidewall 5111 of the second opening 511 is a stepped shape.

Figure 5:
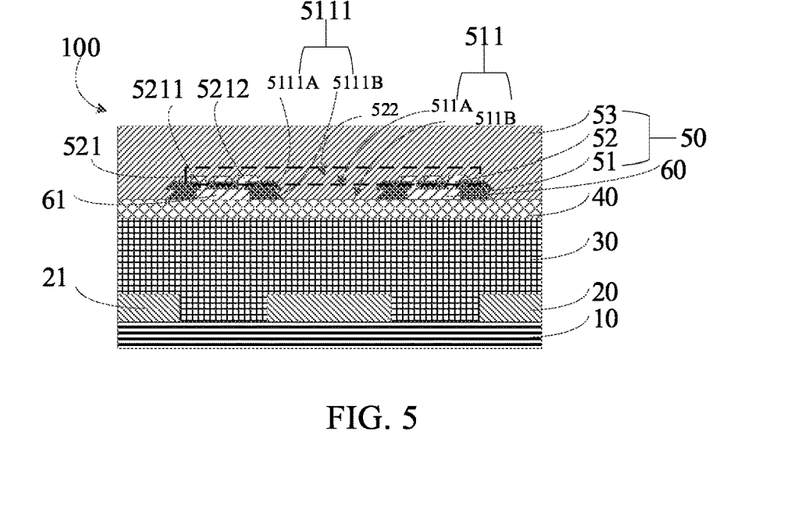
FIG. 5 is a cross-sectional view of the display panel according to a third embodiment of the present application.

Please refer to FIG. 5. FIG. 5 is a cross-sectional view of the display panel according to a third embodiment of the present application.

As shown in FIG. 5, the display panel 100 of the present embodiment is different from the display panel 100 of the previous embodiment in that: the included angle between the sidewall 5111B of the second sub-opening 511B and the side of the first insulating layer 51 close to the display layer 20 is equal to the included angle between the sidewall 5111A of the first sub-opening 511A and the side of the first insulating layer 51 close to the display layer 20.

As shown in FIG. 5, the included angle between the sidewall 5111B of the second sub-opening 511B and the side of the first insulating layer 51 close to the display layer 20 can also be equal to the sidewall 5111A of the first sub-opening 511A and the side of the first insulating layer 51 close to the display layer 20. That is to say, the first sub-opening 511A and the second sub-opening 511B have a same structure. In other words, the second opening 511 comprises a plurality of first sub-openings 511A on top of each other in the vertical direction. At this time, the shape of the sidewall 5111 of the second opening 511 is zigzag. In one embodiment, the area of the orthographic projection of the second sub-opening 511B projected on the substrate 10 is smaller than or equal to the area of the orthographic projection of the first sub-opening 511A projected on the substrate 10.

Certainly, it can be understood that the second opening 511 can also include more than two sub-openings. In this case, included angles between the sidewalls of each sub-opening and the first insulating layer 51 are all equal.

Figure 6:
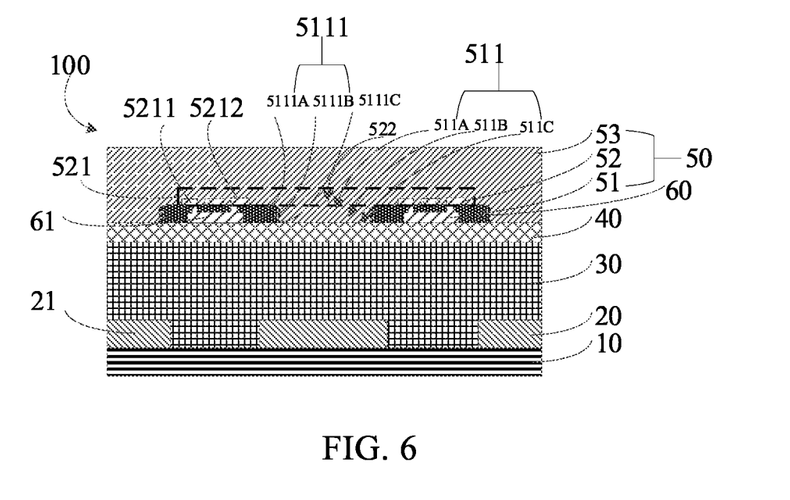
FIG. 6 is a cross-sectional view of the display panel according to a fourth embodiment of the present application.

In other embodiments, as shown in FIG. 6, each of the second openings 511 comprises one of the first sub-openings 511A, one of the second sub-openings 511B, and a third sub-opening 511C. That is to say, the second opening 511 comprises three sub-openings.

The shape of the sidewall 5111A of the first sub-opening 511A, the shape of the sidewall 5111B of the second sub-opening 511B, and a shape of a sidewall 5111C of the third sub-opening 511C are all arcs which face outward (i.e., facing an outside). This means that a raised structure is provided on the sidewall 5111. Radians of the sidewalls of the sub-openings can be equal or unequal. In other embodiments, the arcs can face an inside, which means arc-shaped recesses are defined on the sidewall 5111. It should be noted that an outside is a side away from a geometric center of the second opening 511, and the inside is a side close to the geometric center of the second opening 511. It can be understood that the area of the orthographic projection of the first sub-opening 511A projected on the substrate 10, the area of the orthographic projection of the second sub-opening 511B projected on the substrate 10, and an area of an orthographic projection of the third sub-opening 511C projected on the substrate 10 can be equal or unequal. If the first sub-opening 511A, the second sub-opening 511B, and the third sub-opening 511C, in an order from the bottom to the top, decrease in the area of the orthographic projection on the substrate 10, the third sub-opening 511C with the smallest area also covers the touch electrode 521. Certainly, it can be understood that the specific shape of the sidewall 5111 of the second opening 511 is not limited to the above-mentioned.

The display panel of the present application comprises: a substrate; a display layer arranged on the substrate; the display layer comprising a plurality of light-emitting units; a first insulating layer arranged on the display layer; a plurality of touch units arranged at intervals and disposed on the first insulating layer, each of the touch units is arranged as metal lines in a grid pattern; a second insulating layer comprising a plurality of second openings, positions of the second openings arranged corresponding to positions of grid holes of the touch units; and a third insulating layer covering the touch units and the second openings. A refractive index of a material of the third insulating layer is higher than a refractive index of a material of the second insulating layer. An included angle between a sidewall of each of the second openings and the first insulating layer is an acute angle. A shape of the sidewall 5111 of each of the second openings 511 is a bent shape. Accordingly, on the basis of one embodiment, since the shape of the sidewall 5111 of the second opening 511 of the present embodiment is the bent shape, light emitted from the display panel is emitted after being refracted many times, and thus the light output efficiency can be further improved.

It can be understood that the display panel of the present application can be an organic light emitting diode display panel or a liquid crystal display panel. In a preferred embodiment, in order to further improve display performance and reduce the thickness of the display panel, the display panel of the present application is an organic light emitting diode display panel.

Figure 7:
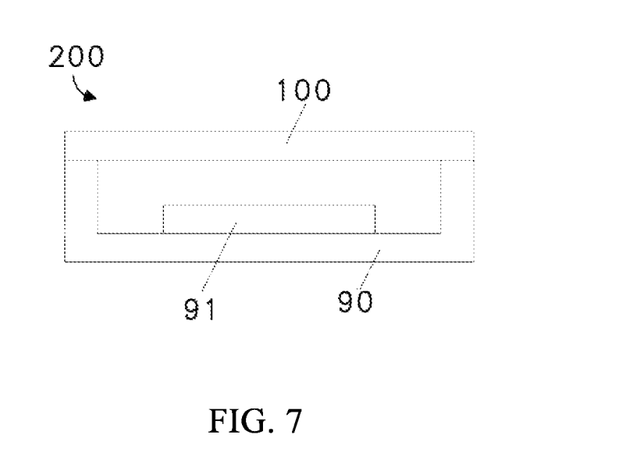
FIG. 7 is a schematic structural view illustrating an electronic device according to one embodiment of the present application.

Please refer to FIG. 7. FIG. 7 is a schematic structural view illustrating an electronic device 200 according to one embodiment of the present application.

The electronic device 200 can comprise any kind of the above-mentioned display panel 100, a control circuit 91, and a housing 90. It should be noted that the electronic device 200 shown in FIG. 7 is not limited to the above content, and can also comprise other devices, such as a camera, an antenna structure, a fingerprint unlocking module, etc.

The display panel 100 is disposed on the housing 90.

In some embodiments, the display panel 100 can be fixed to the housing 90, and the display panel 100 and the housing 90 form a closed space to accommodate components such as the control circuit 91.

In some embodiments, the housing 90 can be made of a flexible material, such as a plastic housing or a silicone housing.

The control circuit 91 is installed in the housing 90, the control circuit 91 can be a motherboard of the electronic device 200, and the control circuit 91 can be integrated with one, two, or more of a battery, an antenna structure, a microphone, a speaker, a headphone interface, a universal serial bus interface, a camera, a distance sensor, an ambient light sensor, a receiver, a processor, and other functional components.

The display panel 100 is installed in the housing 90, and at the same time, the display panel 100 is electrically connected to the control circuit 91 to form a display surface of the electronic device 200. The display panel 100 can comprise a display area and a non-display area. The display area can be used to display images of the electronic device 200 or used for the user to perform touch manipulation. The non-display area can be used to set various functional components.

The electronic device comprises, but is not limited to, mobile phones, tablet computers, computer monitors, game consoles, televisions, display screens, wearable devices, and other household appliances or home appliances with display functions.

The display panel and the electronic device of the present application comprise: a substrate; a display layer disposed on the substrate; the display layer comprising a plurality of light-emitting units; a first insulating layer disposed on the display layer; a plurality of control units arranged at intervals on the first insulating layer, each of the touch units is arranged as metal lines in a grid pattern; a second insulating layer comprising a plurality of second openings, the second openings are located corresponding to grid holes of the touch units; and a third insulating layer covering the touch units and the second openings. A refractive index of a material of the third insulating layer is higher than a refractive index of a material of the second insulating layer. An inclined angle between a sidewall of each of the second openings and the first insulating layer is an acute angle. The insulating layer between two upper and lower conductive layers in the touch unit is combined with the insulating layer above the touch unit to form a light extraction structure, so the present application can save one insulating layer, thus reducing a number of film layers, and reducing a thickness of the display panel.

The display panel and the electronic device of the present application are described in detail above. Specific examples are provided in the present disclosure to describe the working principles and the embodiments of the present application. The description of the above embodiments is only for ease of understanding the present application. At the same time, according to the main idea of the present application, those skilled in the art can modify the embodiments and a range of application. In summary, the content of this specification should not be construed as a limitation to the present application.

What is claimed is:

1. A display panel, comprising:
   a substrate;
   a display layer arranged on the substrate, the display layer comprising a plurality of light sources; and
   a touch layer disposed on one side of the display layer away from the substrate, the touch layer comprising a first insulating layer, a touch electrode layer, and a second insulating layer stacked in sequence;
   wherein the touch electrode layer comprises a plurality of touch electrodes, each of the touch electrodes is provided with a first opening located corresponding to a corresponding one of the light sources, a plurality of second openings are defined in the first insulating layer and located corresponding to the first openings, the second insulating layer fills the first openings and the second openings, and an included angle between a sidewall of each of the second openings and a side of the first insulating layer close to the display layer is an acute angle,
   wherein each of the second openings comprises a first sub-opening and a second sub-opening, and an included angle between a sidewall of each of the second sub-openings and the side of the first insulating layer close to the display layer is not equal to an included angle between a sidewall of each of the first sub-openings and the side of the first insulating layer close to the display layer.

2. The display panel according to claim 1, wherein a refractive index of a material of the second insulating layer is higher than a refractive index of a material of the first insulating layer.

3. The display panel according to claim 2, wherein the refractive index of the material of the second insulating layer is in a range of 1.6 to 1.8, and the refractive index of the material of the first insulating layer is in a range of 1.4 to 1.6.

4. The display panel according to claim 2, wherein the material of the first insulating layer is an inorganic material, and the material of the second insulating layer is an organic material.

5. The display panel according to claim 1, wherein the sidewall of each of the second openings has a bent shape.

6. The display panel according to claim 1, wherein the included angle between the sidewall of each of the second sub-openings and the side of the first insulating layer close to the display layer is greater than the included angle between the sidewall of each of the first sub-openings and the side of the first insulating layer close to the display layer.

7. The display panel according to claim 6, wherein an area of an orthographic projection of the sidewall of each of the second sub-openings projected on the substrate is smaller than or equal to an area of an orthographic projection of the sidewall of each of the first sub-openings projected on the substrate.

8. The display panel according to claim 1, wherein a shape of an orthographic projection of each of the second openings projected on the substrate is same as a shape of an orthographic projection of the corresponding light source projected on the substrate.

9. The display panel according to claim 8, wherein an area of the orthographic projection of each of the second openings projected on the substrate is equal to an area of the orthographic projection of the corresponding light source projected on the substrate.

10. The display panel according to claim 8, wherein a shape of each of the second openings in a top view comprises at least one of circular, elliptical, diamond, or square.

11. The display panel according to claim 1, further comprising a third insulating layer disposed between the display layer and the touch layer, wherein a plurality of bridge lines are arranged between the third insulating layer and the first insulating layer, each of the touch electrodes comprises a first portion and a second portion, and the first portion and the second portion are connected through the bridge lines, wherein a refractive index of a material of the second insulating layer is higher than a refractive index of a material of the first insulating layer, and a refractive index of a material of the third insulating layer is higher than the refractive index of the material of the second insulating layer.

12. An electronic device, the electronic device comprising a display panel, the display panel comprising:
   a substrate;
   a display layer arranged on the substrate, the display layer comprising a plurality of light sources; and
   a touch layer disposed on one side of the display layer away from the substrate, the touch layer comprising a first insulating layer, a touch electrode layer, and a second insulating layer stacked in sequence,
   wherein the touch electrode layer comprises a plurality of touch electrodes, each of the touch electrodes is provided with a first opening located corresponding to a corresponding one of the light sources, a plurality of second openings are defined in the first insulating layer and located corresponding to the first openings, the second insulating layer fills the first openings and the second openings, and an included angle between a sidewall of each of the second openings and a side of the first insulating layer close to the display layer is an acute angle,
   wherein each of the second openings comprises a first sub-opening and a second sub-opening, and an included angle between a sidewall of each of the second sub-openings and the side of the first insulating layer close to the display layer is not equal to an included angle between a sidewall of each of the first sub-openings and the side of the first insulating layer close to the display layer.

13. The electronic device according to claim 12, wherein a refractive index of a material of the second insulating layer is higher than a refractive index of a material of the first insulating layer.

14. The electronic device according to claim 13, wherein the refractive index of the material of the second insulating layer is in a range of 1.6 to 1.8, and the refractive index of the material of the first insulating layer is in a range of 1.4 to 1.6.

15. The electronic device according to claim 13, wherein the material of the first insulating layer is an inorganic material, and the material of the second insulating layer is an organic material.

16. The electronic device according to claim 12, wherein the sidewall of each of the second openings has a bent shape.

17. The electronic device according to claim 12, wherein the included angle between the sidewall of each of the second sub-openings and the side of the first insulating layer close to the display layer is greater than the included angle between the sidewall of each of the first sub-openings and the side of the first insulating layer close to the display layer.

18. The electronic device according to claim 17, wherein an area of an orthographic projection of the sidewall of each of the second sub-openings projected on the substrate is smaller than or equal to an area of an orthographic projection of the sidewall of each of the first sub-openings projected on the substrate.

19. The electronic device according to claim 12, further comprising a third insulating layer disposed between the display layer and the touch layer, wherein a plurality of bridge lines are arranged between the third insulating layer and the first insulating layer, each of the touch electrodes comprises a first portion and a second portion, and the first portion and the second portion are connected through the bridge lines.

20. The electronic device according to claim 19, wherein a refractive index of a material of the second insulating layer is higher than a refractive index of a material of the first insulating layer, and a refractive index of a material of the third insulating layer is higher than the refractive index of the material of the second insulating layer.

\* \* \* \* \*